(12) United States Patent
Lee et al.

(10) Patent No.: US 8,982,620 B2
(45) Date of Patent: Mar. 17, 2015

(54) NON-VOLATILE MEMORY DEVICE AND METHOD OF OPERATING

(71) Applicant: Samsung Electronics Co., Ltd., Suwon-Si, Gyeonggi-Do (KR)

(72) Inventors: Ho-Kil Lee, Yongin-si (KR); Sung-Joon Kim, Seoul (KR); Jin-Yub Lee, Seoul (KR); Sung-Kyu Jo, Hwaseong-si (KR); Seung-Jae Lee, Hwaseong-si (KR); Jong-Hoon Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/044,892

(22) Filed: Oct. 3, 2013

(65) Prior Publication Data
US 2014/0133227 A1 May 15, 2014

(30) Foreign Application Priority Data

Nov. 15, 2012 (KR) ........................ 10-2012-0129703

(51) Int. Cl.
*G11C 16/04* (2006.01)
*G11C 16/22* (2006.01)

(52) U.S. Cl.
CPC ..................................... *G11C 16/22* (2013.01)
USPC .................. 365/185.04; 365/195; 365/185.12

(58) Field of Classification Search
USPC ........... 365/185.04, 195, 185.12, 185.11, 196
See application file for complete search history.

(56) References Cited

U.S. PATENT DOCUMENTS

| | | | |
|---|---|---|---|
| 6,615,324 | B1 | 9/2003 | Fernald |
| 7,031,188 | B2 | 4/2006 | Lee et al. |
| 7,142,452 | B1 * | 11/2006 | Tiwari ...................... 365/185.04 |
| 2004/0193818 | A1 | 9/2004 | Hashimoto et al. |
| 2008/0256288 | A1 | 10/2008 | Matsuoka et al. |
| 2011/0093700 | A1 | 4/2011 | Mittal |
| 2011/0131402 | A1 | 6/2011 | Mittal |
| 2011/0222330 | A1 | 9/2011 | Lee et al. |

FOREIGN PATENT DOCUMENTS

| | | |
|---|---|---|
| JP | 10143434 | 5/1998 |
| JP | 2001166995 | 6/2001 |
| JP | 2005078369 | 3/2005 |
| JP | 2005085398 | 3/2005 |
| KR | 100905640 A | 7/2004 |

* cited by examiner

*Primary Examiner* — David Lam
(74) *Attorney, Agent, or Firm* — Volentine & Whitt, PLLC

(57) ABSTRACT

A method of operating a non-volatile memory includes; during power-on, reading control information from an information block and lock information from an additional information block, then upon determining that a secure block should be locked, generating a lock enable signal that inhibits access to data stored in the secure block, and a read-only enable signal that prevents change in the data stored in the additional information block.

20 Claims, 5 Drawing Sheets

NON-VOLATILE MEMORY DEVICE AND METHOD OF OPERATING

CROSS-REFERENCE TO RELATED APPLICATION

This application claims priority under 35 U.S.C. §119 to Korean Patent Application No. 10-2012-0129703 filed on Nov. 15, 2012, the subject matter of which is hereby incorporated by reference.

BACKGROUND

The inventive concept relate to non-volatile memory devices, and more particularly, to non-volatile memory devices capable of protecting a block of memory storing secure data (hereafter, "a secure data block"). The inventive concept is also related to methods of operating a non-volatile memory device capable of protecting a secure data block.

Semiconductor memory devices may be largely classified as volatile or non-volatile according to their operative nature. Data stored in volatile memory is lost in the absence of applied power. In contrast, non-volatile memory is able to retain stored data in the absence of applied power. As a result, many types of non-volatile semiconductor memory devices have become design mainstays in contemporary consumer electronics and digital logic platforms.

Non-volatile semiconductor memory devices include electrically erasable programmable read-only-memory (EEPROM). Since the constituent memory cells of EEPROM may be electrically erased and programmed, various types of EEPROM have proven to be particularly valuable in storing system programming data and/or auxiliary (or user-defined) data. Among EEPROM, the so-called NAND flash memory may be more densely integrated than NOR flash memory device.

SUMMARY

Embodiments of the inventive concept provide non-volatile memory devices capable of protecting secure data by intelligently inhibiting access to a corresponding secure data block. Embodiments of the inventive concept also provide methods of operating a non-volatile memory device capable of protecting secure data by inhibiting access to a corresponding secure data block.

In accordance with an aspect of the inventive concept, a method of operating a non-volatile memory device comprises method of operating a non-volatile memory device, the method comprising; upon initiating operation of the non-volatile memory device, reading control information from an information block in the non-volatile memory device, and reading lock information from an additional information block in the non-volatile memory device, determining whether a secure block of the non-volatile memory device will be locked in response to the lock information, upon determining that the secure block will be locked, generating a lock enable signal associated with the secure block that inhibits access to data stored in the secure block, and also activating a read-only enable signal associated with the additional information block that prevents change in the data stored in the additional information block.

In accordance with an aspect of the inventive concept, a non-volatile memory device, comprises; a memory core including an information block, an additional information block, a normal block and a secure block, control logic receiving a command and an address and configured to control data access operations directed to the memory core in response to the command and address, and a secure block control circuit configured to activate a lock enable signal associated with the secure block that locks the secure block to inhibit access to data stored in the secure block, and to activate a read-only enable signal associated with the additional information block when the secure block is locked to prevent change to data stored in the additional information block.

In accordance with an aspect of the inventive concept, a method of operating a non-volatile memory device, the method comprises; separately storing in distinctly addressable non-volatile memory cells of a memory cell array general control information characterizing operation of the non-volatile memory device and lock information designating whether a secure block of the memory cell array will be locked, upon power-on for the non-volatile memory device, reading the lock information from an additional information block designated in the memory cell array, and upon determining from the lock information that the secure block will be locked, generating a lock enable signal that inhibits access to data stored in the secure block and also a read-only enable signal that prevents change in the data stored in the additional information block.

DETAILED DESCRIPTION

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure is thorough and complete and fully conveys the inventive concept to those skilled in the art. Throughout the drawings and written description like reference numbers and labels are used to denote like or similar elements.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
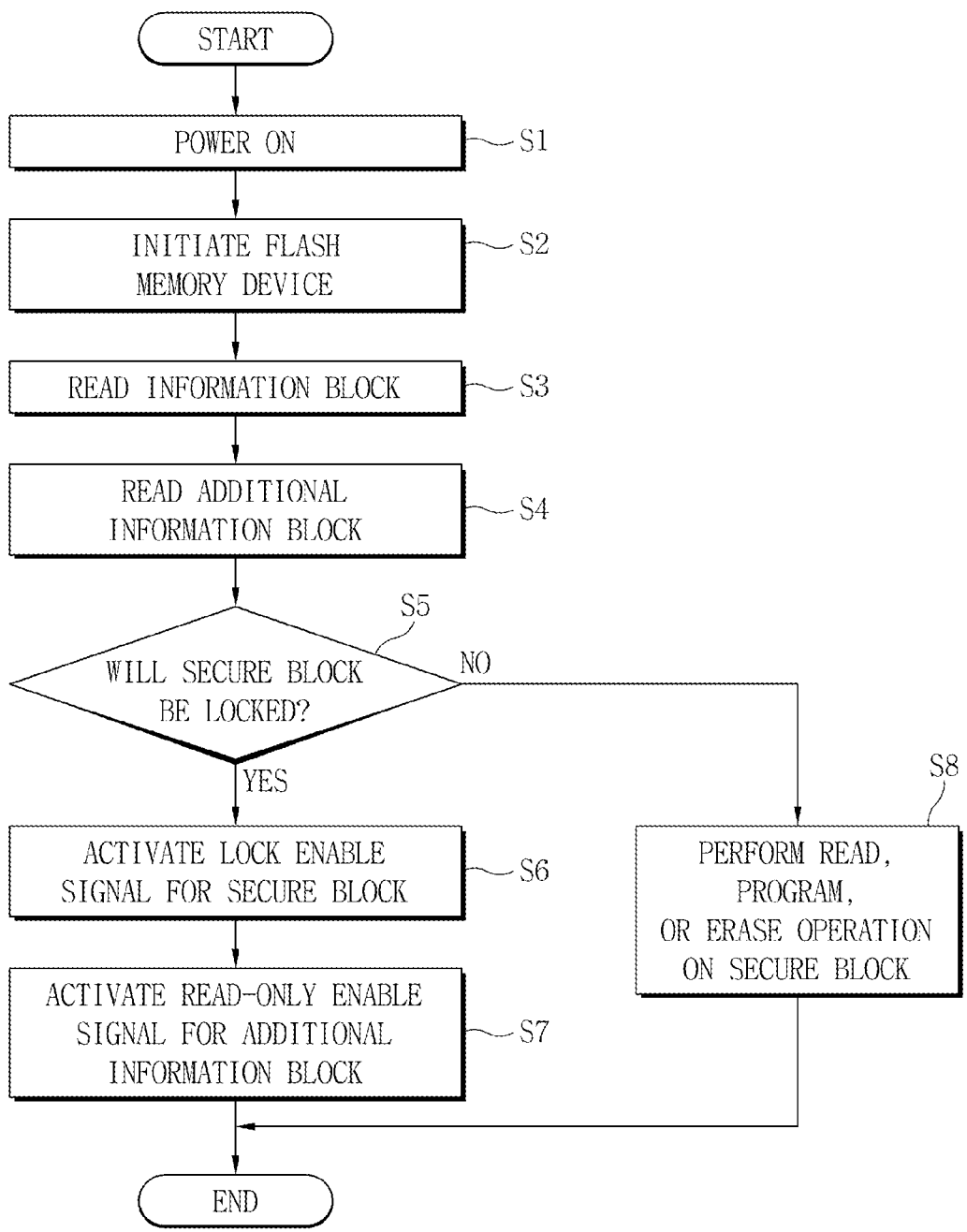
FIG. 1 is a flowchart summarizing one possible method of operating a non-volatile memory device according to an embodiment of the inventive concept.

FIG. 1 is a flowchart summarizing one possible method of operating a non-volatile memory device in accordance with an embodiment of the inventive concept.

Referring to FIG. 1, the method of operating a flash memory device comprises; turning on power to a memory system or host device incorporating one or more non-volatile memory device(s) operated in accordance with the inventive concept (S1). In the illustrated examples that follow, a flash memory device is assumed as an example, recognizing that other types of non-volatile memory may be used. For example, a magneto-resistive random access memory (MRAM) or a phase change random access memory (PRAM) might be used instead.

A conventionally understood power-on routine for the memory system or host device may be used to initiate operation of the flash memory device (S2). Upon initiation of the flash memory device, both "control information" stored in an "information block" (S3) and "lock information" stored in an "additional information block" (S4) are read.

On the basis of the control information and/or lock information respectively read from the information block and the additional information block, a determination is made as to whether or not a particular secure block of the flash memory device will be locked (S5). As noted above, a secure block of non-volatile memory is any memory block storing valid, secure data.

Upon determining that the secure block will not be locked (S5=NO), a "normal" access operation (e.g., a regularly executed read, program or erase operation) may be executed in relation to the secure block. That is, any data previously programmed to the secure block may be read, erased, and/or (re-)programmed (i.e., overwritten) using conventionally understood techniques.

However, upon determining that the secure block will be locked (S5=YES), a corresponding "lock enable signal" is activated in relation to the secure block to effectively inhibit access to any data previously programmed to the secure block (S6) using only a normal access operation. Thus, the term "lock" or "locking" may be understood as inhibiting access to the data stored in a secure block using only normal data access operation(s). After activating the lock enable signal associated with the secure block (S6), a "read-only enable signal" will also be activated in relation to the additional information block (S7). Here, however, the read-only enable signal prevents changes in the data stored in the additional information block, upon determining that the secure block will be locked. This approach will be described in some additional detail hereafter.

Figure 2:
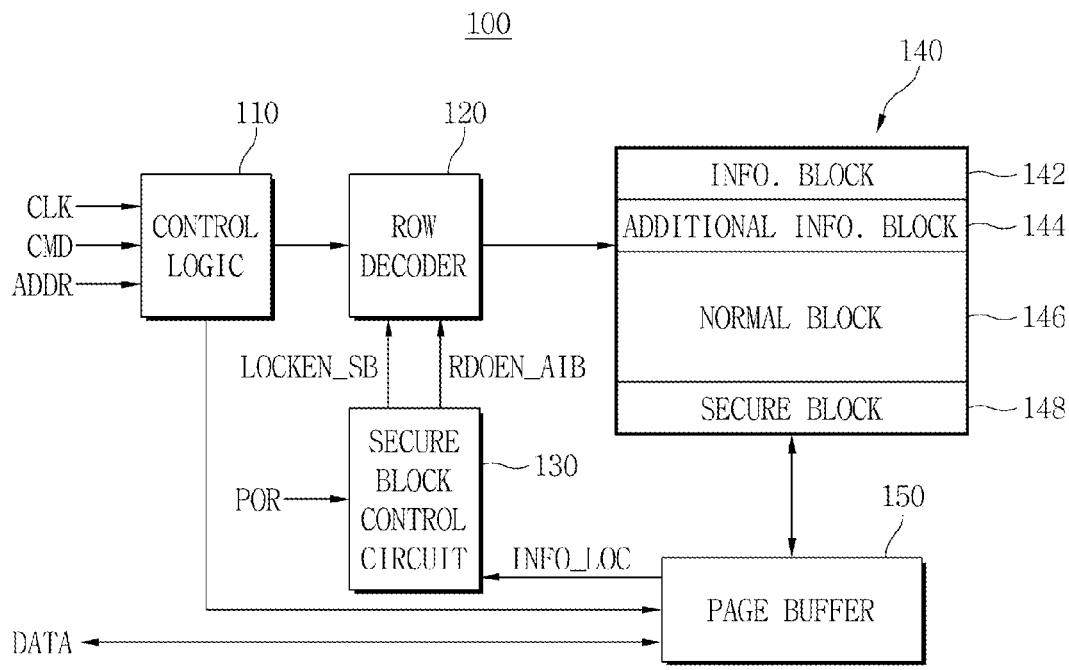
FIGS. 2 and 3 are respective block diagrams illustrating a non-volatile memory device in accordance with an embodiment of the inventive concept.

FIG. 2 is a block diagram illustrating a non-volatile memory device 100 in accordance with an embodiment of the inventive concept.

Referring to FIG. 2, the non-volatile memory device 100 may include a control circuit 110, a row decoder 120, a secure block control circuit 130, a memory cell array 140 and a page buffer 150. The row decoder 120, the memory cell array 140 and the page buffer 150 may be included within a constituent memory core. Therefore, the non-volatile memory device 100 may include the control circuit 110 and secure block control circuit 130 operating in conjunction with a memory core.

The control circuit 110 receives a clock signal CLK, a command CMD and an address ADDR, and controls the execution of a data access operation designated by the clock signal CLK, command CMD, and/or address ADDR in relation to the memory core.

The memory cell array 140 includes an information block 142, an additional information block 144, a normal block 146 and a secure block 148. Each one of these various blocks may be particularly designated by the address ADDR during program/read/erase operations.

The secure block control circuit 130 may be used to activate/deactivate the lock enable signal (LOCKEN_SB) controlling access to data stored in the secure block 148. The secure block control circuit 130 may also be used to activate/deactivate the "read-only enable signal" (EDOEN_AIB) associated with the additional information block 144 when locking is performed on the secure block 148.

In certain embodiments of the inventive concept, the secure block control circuit 130 may be reset by a power-on reset (POR) signal received during a power-on routine.

Control information that may be used to determine whether a secure block of the non-volatile memory device 100 will, or will not be locked may be stored in the additional information block 144. Control information characterizing the general operating conditions for the non-volatile memory device 100 may be stored in the information block 142.

The row decoder 120 may be used select a word line based on the address ADDR using a word line driving signal. The page buffer 150 may be used to temporarily store "read data" provided from the memory cell array 140 during a read operation, or to temporarily store "write data" received during a program operation (the read/write data, collectively, DATA). In the illustrated example of FIG. 1, the page buffer 150 receives "lock information" (INFO_LOC) stored in the additional information block 144 using (e.g.,) information set using fuses or anti-fuses.

During a power-on routine, for example, the secure block control circuit 130 may receive the lock information from the page buffer 150 and generate the lock enable signal (LOCK-EN_SB) associated with the secure block 148, and the read-only enable signal (RDOEN_AIB) associated with the additional information block 144 in response to the lock information. In turn, the row decoder 120 may lock the secure block 148 in response to the lock enable signal (LOCK-EN_SB) and the read-only enable signal (RODEN_AIB) thereby preventing an change (erase/program) in the data stored in the additional information block 144.

Figure 3:
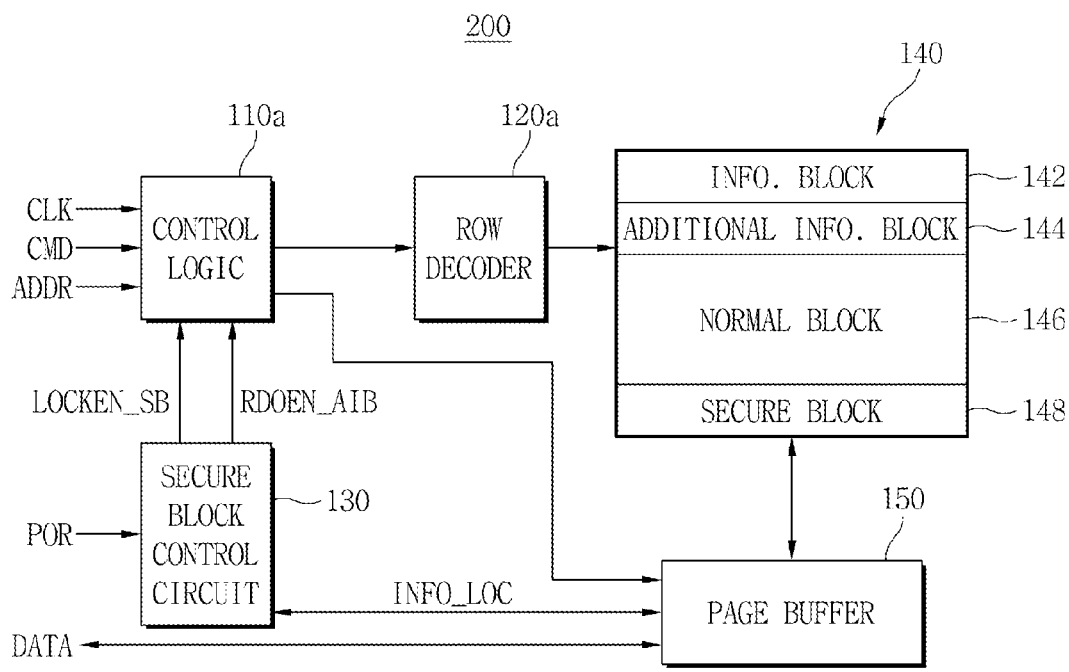

FIG. 3 is a block diagram illustrating a non-volatile memory device 200 in accordance with another embodiment of the inventive concept.

Referring to FIG. 3, the non-volatile memory device 200 may include a control circuit 110a, a row decoder 120a, a secure block control circuit 130, a memory cell array 140 and a page buffer 150. Here again, the row decoder 120a, memory cell array 140 and page buffer 150 may be included in a constituent memory core. Therefore, the non-volatile memory device 200 may include the control circuit 110a and secure block control circuit 130 operated in conjunction with a memory core.

The control circuit 110a receives the clock signal CLK, command CMD and/or address ADDR, and controls the memory core accordingly. Further, the control circuit 110a may lock the secure block 148 in response to the lock enable signal (LOCKEN_SB) associated with the secure block 148 and the read-only enable signal (RODEN_AIB) associated with the additional information block 144, thereby preventing any change in the data stored in the additional information block 144. Therefore, in the non-volatile memory device 200 of FIG. 3, the control circuit 110a, as opposed to the row decoder 120a, may be used to inhibit access to the secure block 148, and prevent any change in the data stored in the additional information block 144.

As before, the memory cell array 140 includes the information block 142, additional information block 144, normal block 146 and secure block 148. The secure block control circuit 130 may be used to activate the lock enable signal (LOCKEN_SB) associated with the secure block 148 to inhibit access to the secure block 148, and may be used to activate the read-only enable signal (EDOEN_AIB) associated with the additional information block 144 when locking is performed on the secure block 148.

The lock information used to determines whether or not the secure block will be locked may be stored in the additional information block 144, while general control information characterizing the operating conditions of the non-volatile memory device 100 may be stored in the information block 142.

The row decider 120 may be used to select a word line based on the address ADDR using a word line driving signal. The page buffer 150 may be used either to temporarily store read data or write data. The page buffer 150 may also receive lock information INFO_LOC from the additional information block 144, and temporarily store the lock information INFO_LOC. Here, the lock information may be fuse information.

The secure block control circuit 130, upon receiving the lock information from the page buffer 150, will generate the lock enable signal (LOCKEN_SB) associated with the secure block 148, and the read-only enable signal (RDOEN_AIB0 associated with the additional information block 144. The row decoder 120 may be used to lock the secure block 148 in response to the lock enable signal (LOCKEN_SB), and prevent any change in the data stored in the additional information block 144 in response to the read-only enable signal (RODEN_AIB).

Figure 4:
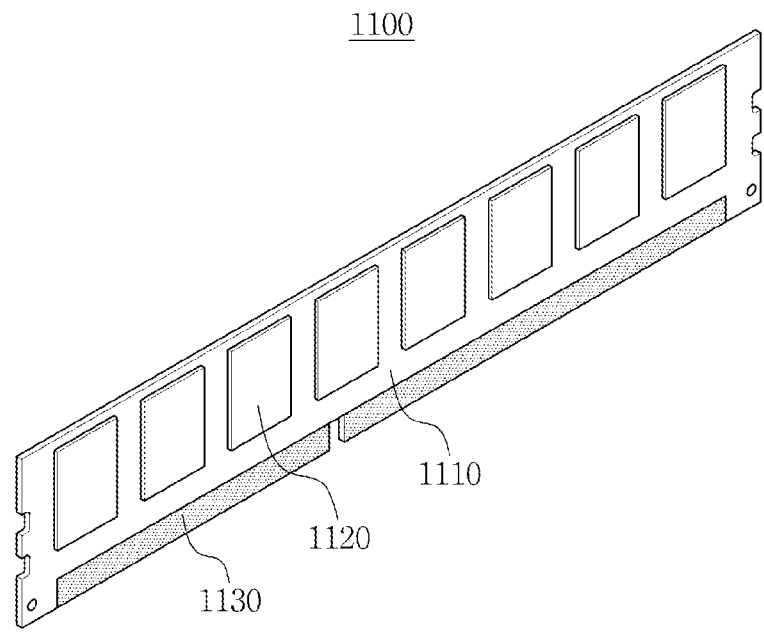
FIG. 4 is a perspective view illustrating one possible example of a memory module including a non-volatile memory device in accordance with an embodiment of the inventive concept.

FIG. 4 is a perspective diagram illustrating one possible memory module 1100 including a non-volatile memory device in accordance with an embodiment of the inventive concept.

Referring to FIG. 4, the memory module 1100 may include a printed circuit board (PCB) 1110, a plurality of non-volatile memory devices 1120, and a connector 1130. The plurality of non-volatile memory devices 1120 may be bonded to opposing principle (top and bottom) surfaces of the PCB 1110. The connector 1130 may be electrically connected to the plurality of non-volatile memory devices 1120 through conductive lines (not shown). Also, the connector 1130 may be connected to a slot of an external host.

Figure 5:
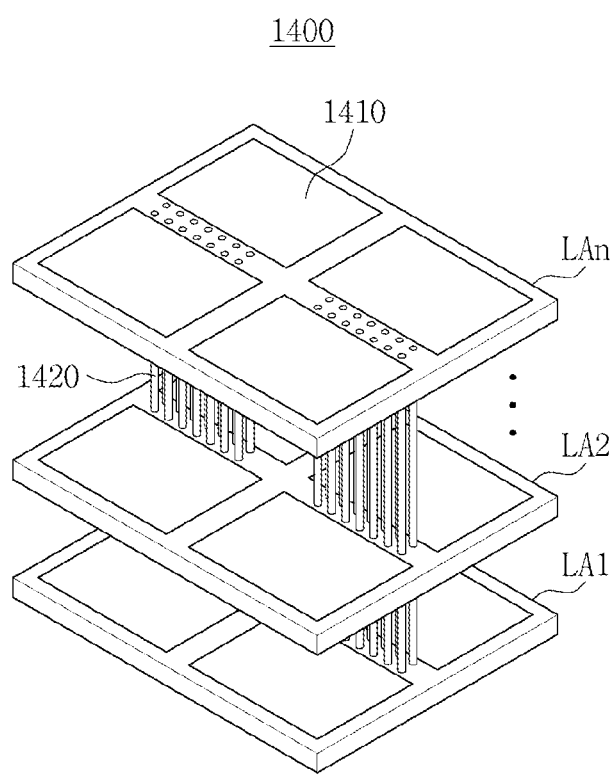
FIG. 5 is a perspective view illustrating one possible example of a stacked semiconductor device including a non-volatile memory device in accordance with an embodiment of the inventive concept.

FIG. 5 is a perspective view illustrating one possible example of a stacked semiconductor device 1400 including a non-volatile memory device in accordance with an embodiment of the inventive concept. In the memory modules of FIG. 4, each of the non-volatile memory devices may include a plurality of semiconductor layers LA1 to LAn.

In the stacked semiconductor device 1400, the plurality of stacked semiconductor layers LA1 to LAn may be connected to one another through through-silicon vias (TSVs) 1420.

Figure 6:
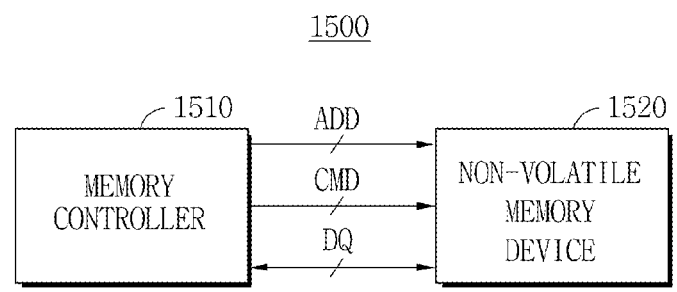
FIG. 6 is a general block diagram illustrating a memory system in accordance with an embodiment of the inventive concept.

FIG. 6 is a general block diagram of a memory system in accordance with an embodiment of the inventive concept.

Referring to FIG. 6, the memory system 1500 includes a memory controller 1510 and a non-volatile memory device 1520.

The memory controller 1510 generates address signals ADD and command signals CMD, and provides the address signals ADD and the command signals CMD to the non-volatile memory device 1520 through buses. Data DQ may be transmitted from the memory controller 1510 to the non-volatile memory device 1520 through the buses, or transmitted from the non-volatile memory device 1520 to the memory controller 1510 through the buses.

The non-volatile memory device 1520 may include a non-volatile memory device according to embodiments of the inventive concepts. Therefore, the non-volatile memory device 1520 activates a lock enable signal associated with a secure block to inhibit access to data stored in the secure block, and activates a read-only enable signal associated with an additional information block when locking is performed on the secure block. Therefore, the secure block of the non-volatile memory device 1520 cannot be accessed after locking is performed on the secure block.

Figure 7:
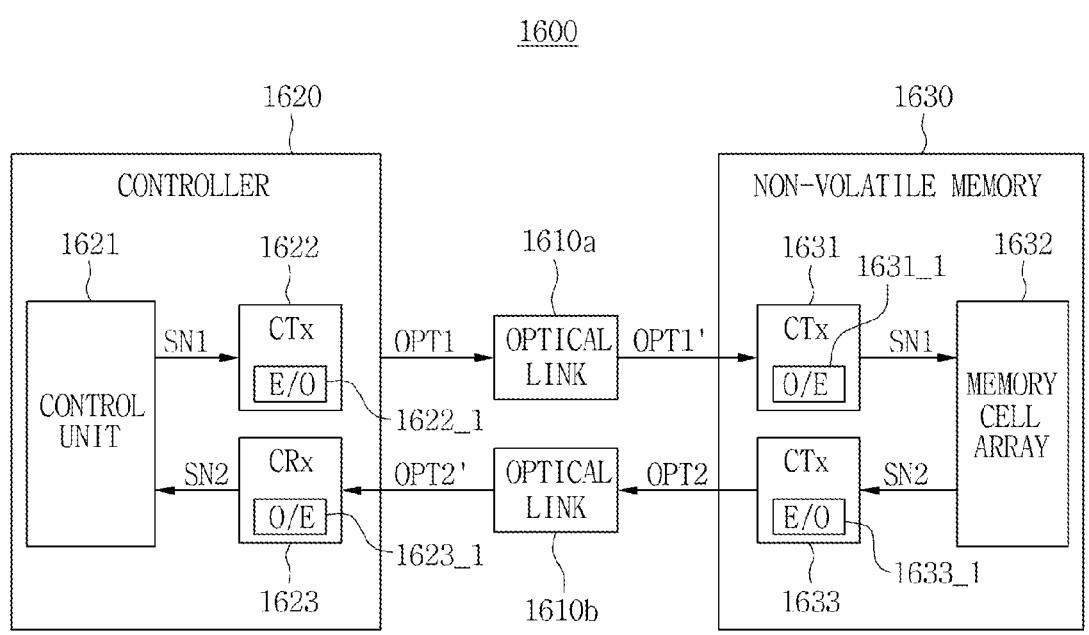
FIG. 7 is a block diagram illustrating one possible example of a memory system including a non-volatile memory device and an optical connection in accordance with an embodiment of the inventive concept.

FIG. 7 is a block diagram illustrating one possible memory system including a non-volatile memory device and an optical connection in accordance with an embodiment of the inventive concept.

Referring to FIG. 7, the memory system 1600 may include a controller 1620, a non-volatile memory device 1630, and a plurality of optical links 1610a and 1610b configured to interconnect the controller 1620 and the non-volatile memory device 1630. The controller 1620 may include a control unit 1621, a first transmitter 1622, and a first receiver 1623. The control unit 1621 may transmit a control signal SN1 to the first transmitter 1622.

The first transmitter 1622 may include a first optical modulator 1622_1, which may convert the control signal SN1, which is an electric signal, into a first optical transmission signal OPT1, and transmit the first optical transmission signal OPT1 to the optical link 1610a.

The first receiver 1623 may include a first optical demodulator 1623_1, which may convert a second optical receiving signal OPT2' received from the optical link 1610b into a data signal SN2, which is an electric signal, and transmit the data signal SN2 to the control unit 1621.

The non-volatile memory device 1630 may include a second receiver 1631, a memory cell array 1632, and a second transmitter 1633. The second receiver 1631 may include a second optical modulator 1631_1, which may convert a first optical receiving signal OPT1' received from the optical link 1610a into the control signal SN1, which is an electric signal, and transmit the control signal SN1 to the memory cell array 1632.

In the memory cell array 1632, data may be written under the control of the control signal SN1, or the data signal SN2 output from the memory cell array 1632 may be transmitted to the second transmitter 1633.

The second transmitter 1633 may include a second optical modulator 1633_1, which may convert the data signal SN2, which is an electric signal, into a second optical data signal OPT2, and transmit the second optical data signal OPT2 to the optical link 1610b.

The non-volatile memory device 1630 may include a non-volatile memory device according to embodiments of the inventive concepts. Therefore, the non-volatile memory device 1630 activates a lock enable signal associated with a secure block to inhibit access to data stored in the secure block, and also activates a read-only enable signal associated with an additional information block when locking is performed on the secure block. Therefore, the secure block of the non-volatile memory device 1630 cannot be accessed after locking is performed on the secure block.

Figure 8:
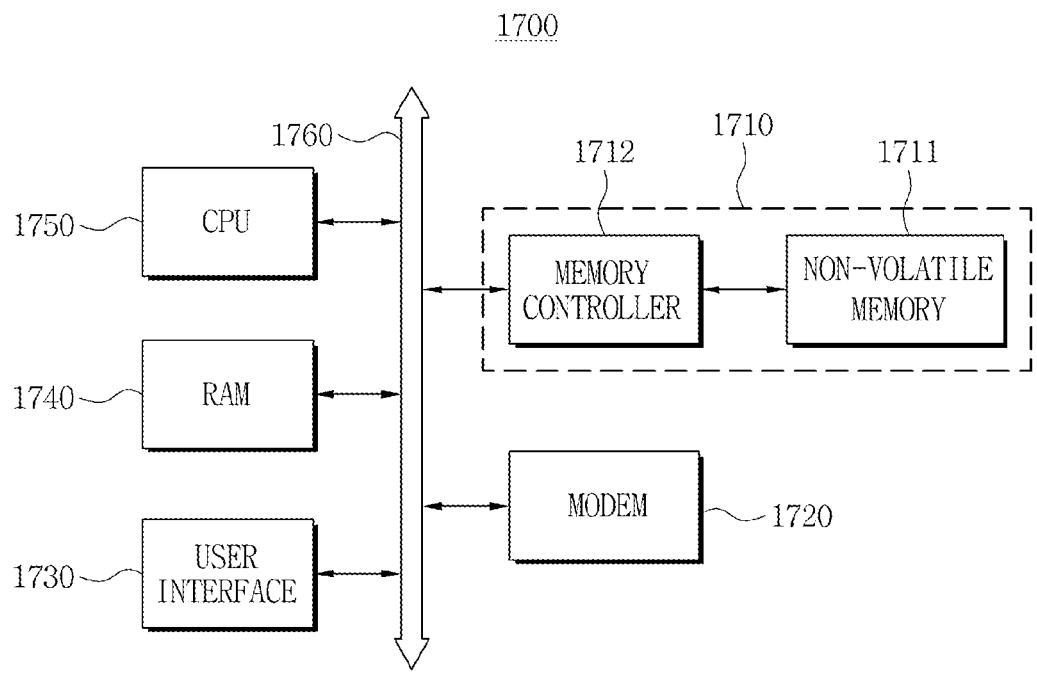
FIG. 8 is a block diagram illustrating one possible example of an information processing system including a non-volatile memory device in accordance with an embodiment of the inventive concept.

FIG. 8 is a block diagram illustrating one possible example of an information processing system 1700 including a non-volatile memory device in accordance with an embodiment of the inventive concept.

Referring to FIG. 8, a non-volatile memory device 1711 may be mounted in a information processing system 1700, such as a mobile device or a desktop computer. The information processing system 1700 may include a memory system 1710, a modem 1720, a central processing unit (CPU) 1750, RAM 1740 and a user interface 1730.

The memory system 1710 may include a non-volatile memory device 1711 and a memory controller 1712. Data processed by the CPU 1750 or data input from the exterior may be stored in the non-volatile memory device 1711.

The non-volatile memory device 1711 may include a non-volatile memory device according to embodiments of the inventive concepts. Therefore, the non-volatile memory device 1711 activates a lock enable signal of a secure block to inhibit access to the secure block, and activates a read-only enable signal of an additional information block when locking is performed on the secure block. Therefore, the secure block of the non-volatile memory device 1711 cannot be accessed after locking is performed on the secure block.

Though not shown in FIG. 8, the information processing system 1700 may be further be provided with an application chipset, a camera image processor, and an input and output device, as will be understood by those skilled in the art.

Figure 9:
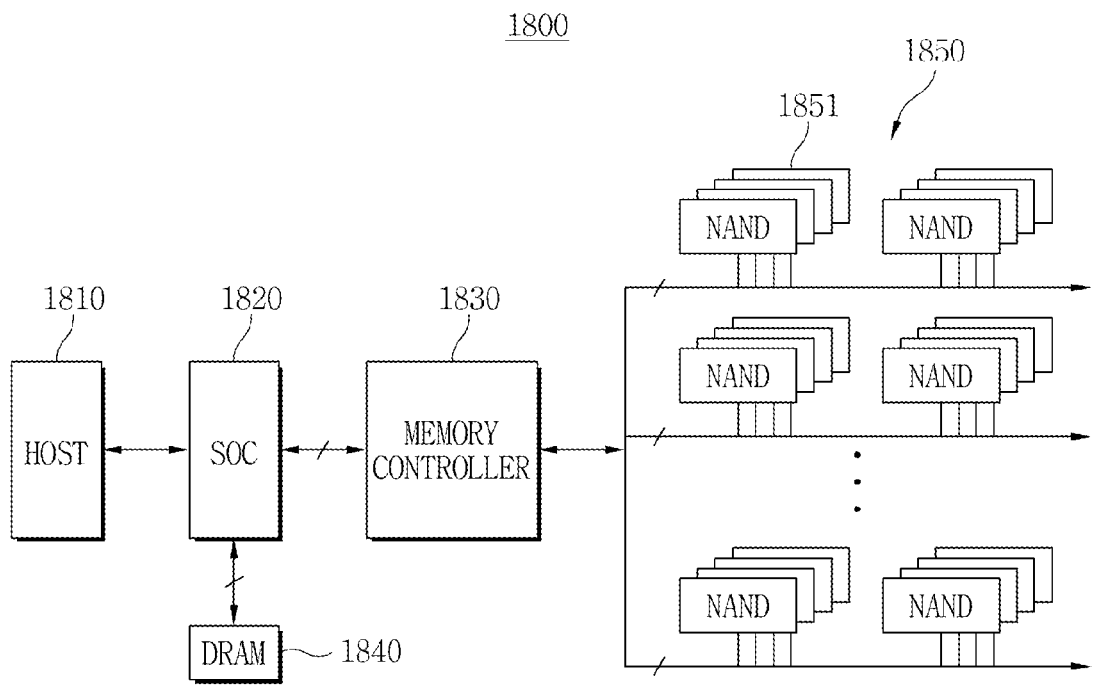
FIG. 9 is a block diagram illustrating one possible example of a computer system including a non-volatile memory device in accordance with an embodiment of the inventive concept.

FIG. 9 is a block diagram illustrating one possible example of a computer system 1800 including a non-volatile memory device in accordance with an embodiment of the inventive concept. In FIG. 9, a memory system 1850 may be implemented as a data processing device, such as a solid state drive (SSD).

Referring to FIG. 9, a computer system 1800 may include a plurality of NAND-type flash memory devices 1851, a memory controller 1830 controlling data processing operation of each of the NAND-type flash memory devices 1851, a volatile memory device 1840 such as DRAM, a system-on-chip (SOC) 1820 that controls storing data communication between a host 1810 and the memory controller 1830 into the volatile memory device 1840.

Each of the NAND-type flash memory devices 1851 activates a lock enable signal of a secure block to inhibit access to the secure block, and activates a read-only enable signal of an additional information block when locking is performed on the secure block. Therefore, the secure block of each of the NAND-type flash memory devices 1851 cannot be accessed after locking is performed on the secure block.

In the above, a NAND-type flash memory device is mainly described, but embodiments of the inventive concepts may be generally applied to not only a flash memory device but also non-volatile memory devices including a magneto-resistive random access memory (MRAM) and a phase change random access memory (PRAM).

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A method of operating a non-volatile memory device, the method comprising:
   upon initiating operation of the non-volatile memory device, reading control information from an information block in the non-volatile memory device, and reading lock information from an additional information block in the non-volatile memory device;
   determining whether a secure block of the non-volatile memory device will be locked in response to the lock information;
   upon determining that the secure block will be locked, generating a lock enable signal associated with the secure block that inhibits access to data stored in the secure block, and also activating a read-only enable signal associated with the additional information block that prevents change in the data stored in the additional information block.

2. The method according to claim 1, further comprising:
   upon determining that the secure block will not be locked, performing at least one of a read operation, a program operation, and an erase operation on the secure block.

3. The method according to claim 1, wherein the information block and the additional information block are separate and distinctly addressable regions within a memory cell array of the non-volatile memory device.

4. The method of claim 1, wherein the non-volatile memory comprises a row decoder that receives an address, and the method further comprises:
   applying the lock enable signal to the row decoder to prevent selection of any word line in the secure block during any data access operation.

5. The method of claim 4, further comprising:
   applying the read-only signal to the row decoder to prevent selection of any word line in the additional information block during an erase operation and a program operation.

6. The method of claim 1, wherein the non-volatile memory comprises control logic that receives a command, and the method further comprises:
applying the lock enable signal to the control logic to prevent selection of any word line in the secure block during a data access operation identified by the command.

7. The method of claim 6, further comprising:
applying the read-only signal to the control logic to prevent selection of any word line in the additional information block during an erase operation identified by the command.

8. The method of claim 6, further comprising:
applying the read-only signal to the control logic to prevent selection of any word line in the additional information block during a program operation identified by the command.

9. A non-volatile memory device, comprising:
a memory core including an information block, an additional information block, a normal block and a secure block;
control logic receiving a command and an address and configured to control data access operations directed to the memory core in response to the command and address; and
a secure block control circuit configured to activate a lock enable signal associated with the secure block that locks the secure block to inhibit access to data stored in the secure block, and to activate a read-only enable signal associated with the additional information block when the secure block is locked to prevent change to data stored in the additional information block.

10. The device of claim 9, wherein upon initiation of the non-volatile memory device the control logic is further configured to read lock information used to determine whether or not the secure block will be locked from the additional information block.

11. The device of claim 10, wherein upon initiation of the non-volatile memory device the control logic is further configured to read control information stored in the information block.

12. The device of claim 10, wherein upon determining on the basis of the lock information that the secure block will be locked, the control logic is further configured to prevent selection of any word line in the additional information block during an erase operation and a program operation.

13. The device of claim 9, further comprising a row decoder controlled by the control logic, wherein the decoder that receives the lock enable signal to prevent selection of any word line in the secure block in response to the address.

14. The device of claim 9, further comprising a row decoder controlled by the control logic, wherein the decoder receives the read-only signal to prevent selection of any word line in the additional information block during an erase operation and a program operation in response to the address.

15. The device of claim 9, further comprising a page buffer configured to receive the lock information from the additional information block and temporarily store the lock information.

16. The device according to claim 15, wherein the lock information is fuse information.

17. The device of claim 9, wherein upon determining on the basis of the lock information that the secure block will not be locked, the control logic is further configured to performing at least one of a read operation, a program operation, and an erase operation on the secure block.

18. The device of claim 9, wherein the information block and the additional information block are separate and distinctly addressable regions within a memory core.

19. A method of operating a non-volatile memory device, the method comprising:
separately storing in distinctly addressable non-volatile memory cells of a memory cell array general control information characterizing operation of the non-volatile memory device and lock information designating whether a secure block of the memory cell array will be locked;
upon power-on for the non-volatile memory device, reading the lock information from an additional information block designated in the memory cell array; and
upon determining from the lock information that the secure block will be locked, generating a lock enable signal that inhibits access to data stored in the secure block and also a read-only enable signal that prevents change in the data stored in the additional information block.

20. The method of claim 19, wherein the non-volatile memory comprises a row decoder that receives an address, and the method further comprises:
applying the lock enable signal to the row decoder to prevent selection of any word line in the secure block during any data access operation; and
applying the read-only signal to the row decoder to prevent selection of any word line in the additional information block during an erase operation and a program operation.

* * * * *